(12) United States Patent
Mei et al.

(10) Patent No.: US 6,807,079 B2
(45) Date of Patent: Oct. 19, 2004

(54) DEVICE HAVING A STATE DEPENDENT UPON THE STATE OF PARTICLES DISPERSED IN A CARRIER

(75) Inventors: Ping Mei, Palo Alto, CA (US); Warren Jackson, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/285,802

(22) Filed: Nov. 1, 2002

(65) Prior Publication Data

US 2004/0085797 A1 May 6, 2004

(51) Int. Cl.[7] .................................................. G11C 17/00
(52) U.S. Cl. ........................ 365/96; 365/225.7; 257/530
(58) Field of Search .............................. 365/96, 225.7, 365/225.5, 103, 104; 257/530, 379, 50

(56) References Cited

U.S. PATENT DOCUMENTS

| | | | | |
|---|---|---|---|---|
| 4,922,319 A | * | 5/1990 | Fukushima | 257/379 |
| 5,444,290 A | * | 8/1995 | Paz De Araujo et al. | 257/530 |
| 5,811,870 A | * | 9/1998 | Bhattacharyya et al. | 257/530 |
| 5,834,824 A | * | 11/1998 | Shepherd et al. | 257/530 |
| 6,344,373 B1 | * | 2/2002 | Bhattacharyya et al. | 438/131 |
| 6,418,049 B1 | * | 7/2002 | Kozicki et al. | 365/174 |

* cited by examiner

*Primary Examiner*—Gene Auduong

(57) ABSTRACT

A device that includes a layer of material having particles dispersed therein, a first electrode on a first surface of the layer, and a second electrode on a second surface of the layer opposite the first surface. A state of the particles is changed when a prescribed voltage is applied across the first and second electrodes.

48 Claims, 4 Drawing Sheets

DEVICE HAVING A STATE DEPENDENT UPON THE STATE OF PARTICLES DISPERSED IN A CARRIER

BACKGROUND

Fuse and anti-fuse switches typically include a thin film disposed between first and second electrodes. Such switches have been employed, for example, in memory devices, wherein a selected phase or memory state, such as "1" or "0", is created by selectively applying current or voltage across the first and second electrodes in order to vary the conductance between the first and second electrodes. Such memory devices are typically, but not necessarily, one-time programmable or write-once memory devices. Alternatively, such memory devices can be erasable or phase-reversible to facilitate numerous read/write cycles.

One limitation of known memory devices that employ fuse or anti-fuse switches is that the electrode material is designed to serve as both part of a conduction line of the memory device, and as an electrode of the switch itself However, the optimum material for the switch electrodes is oftentimes not the optimum material for the conduction lines, thereby resulting in undesirable trade-offs. For example, a switch known as a Le Comber switch utilizes diffusive metals, such as gold (Ag), for one of the two electrodes. However, diffusive metals such as gold may not be the most desirable material for the conduction lines. One solution to this problem is to employ multi-layer metal films for conduction lines and memory cells. However, this solution requires additional processing steps that increase the cost of device fabrication.

Another limitation of known fuse or anti-fuse switches and memory devices incorporating the same is that the thin film material has anisotropic electrical properties, which requires costly photolithographic processing and limits the achievable density. For a fuse switch, the thin film material is required to exhibit low electrical resistance between the first and second electrodes, before switching (i.e., when in the "on" state), while exhibiting high electrical resistance between neighboring switches, and is also required to exhibit high electrical resistance between the first and second electrodes, after switching (i.e., when in the "off" state). Anti-fuse switches require similar anisotropic electrical properties.

SUMMARY

The present invention encompasses, among other things, a device that includes a layer of material having particles dispersed therein, a first electrode on a first surface of the layer, and a second electrode on a second surface of the layer opposite the first surface. A state of the particles is changed when a prescribed voltage is applied across the first and second electrodes.

The present invention additionally encompasses various embodiments of switches and memory cells, and devices incorporating the same.

Other aspects and advantages of the present invention will become apparent from the following detailed description, taken in conjunction with the accompanying drawings, illustrating by way of example the principles of the present invention.

DETAILED DESCRIPTION

Figure 1A:
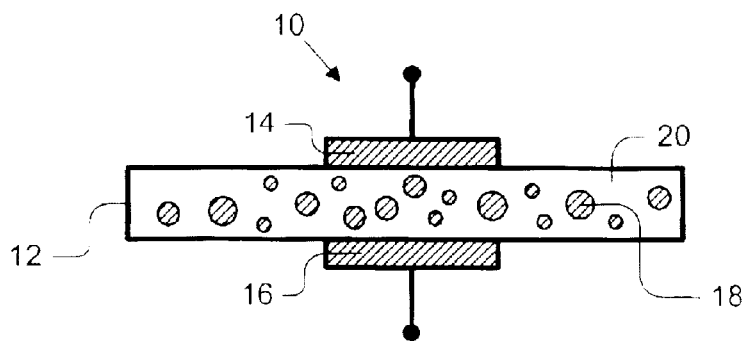
FIGS. 1A–1D are partial, cross-sectional views of a device according to an embodiment of the present invention.

Various embodiments of the present invention are described below. These embodiments are given by way of illustration, and are not intended to limit the scope of the present invention.

The term "microparticles" as used herein refers to particles having a maximum dimension that is much smaller than the thickness of the carrier in which the particles are dispersed, for example, $\frac{1}{3}$ to $\frac{1}{20}$ of the thickness of the carrier. In general, the size of the microparticles used in the practice of the present invention is scalable in accordance with the geometry of the host device, and is not limiting to the present invention. The term "nanoparticles" as used herein refers to particles having a maximum dimension in the range of a nanometer to a micrometer. Preferably, the particles are either spherical or rod-shaped. However, neither the size nor shape of the particles are limiting to the present invention, in its broadest sense.

The term "carrier" as used herein refers to an electrically resistive material within which the particles are dispersed. The carrier material may suitably be composed of polyamide, polyester, UV-curable polymer, or spin-on glass, or any suitable combination of these or other electrically resistive materials, such as electrically-resistive organic or inorganic materials. Preferably, the carrier material is a thin, flexible, resilient, or viscoelastic material, such as a gel or gel-like material. Alternatively, the carrier material can be a liquid or viscous material sandwiched between, or encapsulated by, other material layers, for example, in a manner such as the liquid crystal material in a liquid crystal display (LCD) panel. The use of such carrier materials facilitates simple and inexpensive fabrication, using techniques such as web or roll-to-roll transfer printing. However, the particular composition and physical properties of the carrier material are not limiting to the present invention.

The term "switch" as used herein refers to a device which has at least two different phases or states, wherein the state of the device can be programmed at least once. The term "switch" as used herein broadly encompasses both one-time programmable (write-once) devices, as well as erasable or phase-reversible (write-many) devices whose phase or state can be switched or re-programmed multiple times. The number of times that the phase or state of the switch can be re-programmed or switched is not limiting to the present invention.

With reference now to FIGS. 1A–1D, there can be seen an anti-fuse switch 10 constructed in accordance with a first embodiment of the present invention. The anti-fuse switch 10 includes a layer or thin film 12 disposed between a first electrode 14 and a second electrode 16. The layer 12 is formed by particles 18 dispersed in a carrier 20. The particles 18 of this embodiment are preferably microparticles or nanoparticles that may suitably be composed of a diffusive metal, such as silver, palladium-silver alloy, copper, aluminum, carbon, carbon-silver blend, or gold, or any other suitable organic, inorganic, or ferroelectric material that is electrically conductive, or any combination thereof.

Figure 1B:
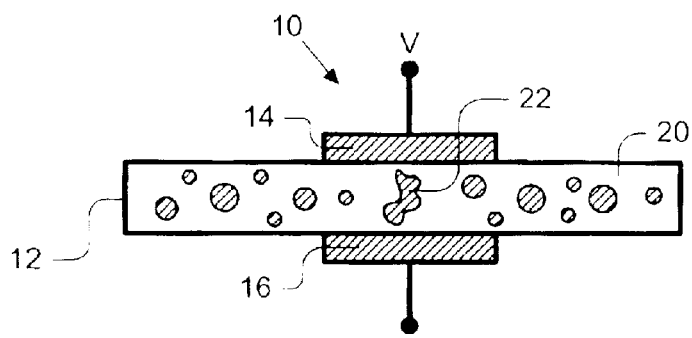
Figure 1C:
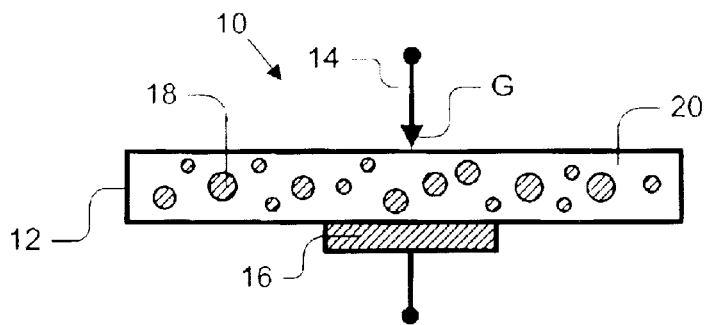
Figure 1D:
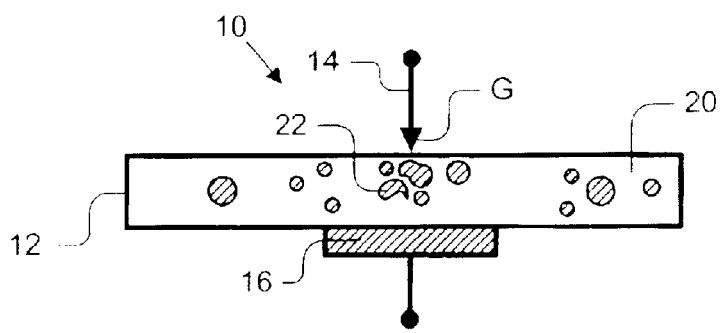

In operation, the anti-fuse switch 10 depicted in FIGS. 1A–1D works in the following manner. As is depicted in FIGS. 1A and 1C, when the switch 10 is in its initial state, the particles 18 are dispersed and do not form a conductive path between the first and second electrodes 14, 16. As is depicted in FIGS. 1B and 1D, when a prescribed voltage ("turn-on voltage"), e.g., a high voltage, is applied across the first and second electrodes 14, 16, the particles 18 diffuse and reorient due to the electrostatic forces on the particles from the electrodes. The diffusion of the particles 18 causes an agglomeration or concentration (increased density) of particles 18 in an electrode region of the carrier 20 between the first and second electrodes 14, 16, and a depletion (decreased density) of the particles 18 in peripheral regions of the carrier 20 outside of the electrode region. The thickness of the carrier 20 and the dispersion density of the particles 18 in the carrier 20 are preferably selected so that the probability of obtaining at least one conductive path between the first and second electrodes 14, 16 is close to 100%.

The term "percolation threshold" as used herein refers to a thickness of the carrier 20 at which the probability of obtaining at least one conductive path between the first and second electrodes 14, 16 is close to 100% for a given voltage applied across the first and second electrodes 14, 16. This probability depends exponentially on the thickness of the carrier material and on the volume fraction of the carrier material occupied by the particles 18.

Assuming that the percolation threshold constraint is satisfied, the migration of the particles 18 that occurs in response to the application of the turn-on voltage results in the formation of a conductive path between the first and second electrodes 14, 16, by way of the particles 18 agglomerating or fusing together to form a wire or fuse 22 between the first and second electrodes 14, 16, as is depicted in FIGS. 1B and 1D. Thus, when a turn-on voltage is applied across the first and second electrodes 14 and 16, the switch 10 is turned on; when a turn-on voltage is not applied across the first and second electrodes 14 and 16, the switch 10 is turned off.

The speed and reliability of the switch 10 can be enhanced by application of a turn-on voltage in the form of a large electric field gradient G having sharp field tips, as is depicted in FIGS. 1C–1D. The field gradient G exerts lateral forces on the particles 18 that induce movement of the particles 18 towards the center of the electrode region 17 of the carrier 20, as is depicted in FIG. 1D. The field gradient G can be created in any suitable manner, such as, for example, by using an appropriately-shaped electrode or Spindt emitter 21.

Figure 2A:
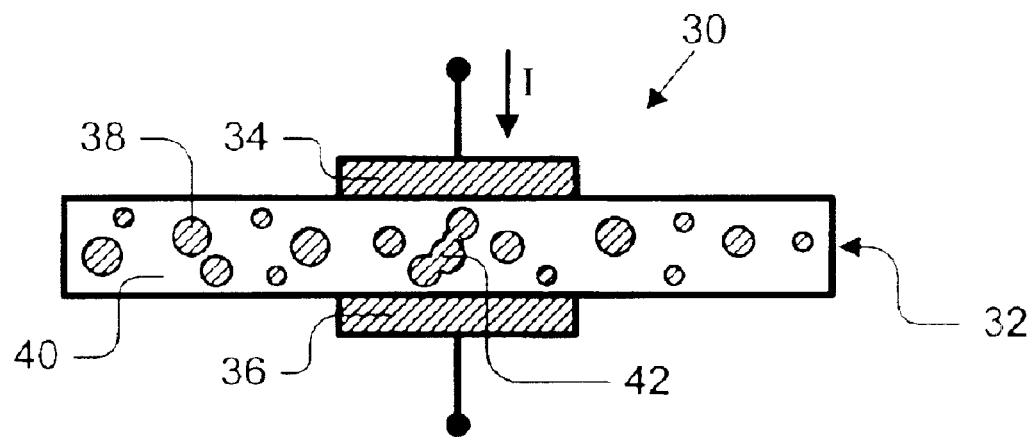
FIGS. 2A–2B are partial, cross-sectional views of a device according to another embodiment of the present invention.
Figure 2B:
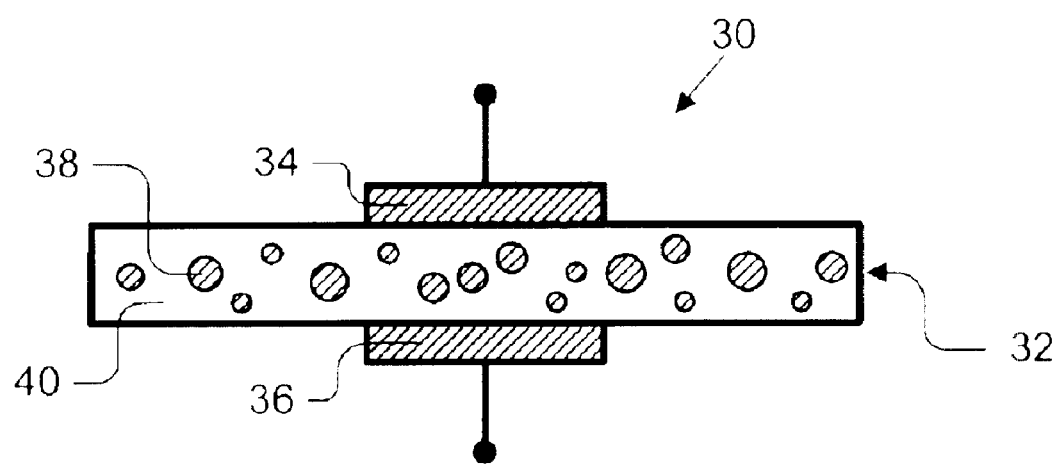

With reference now to FIGS. 2A–2B, there can be seen a fuse switch 30 constructed in accordance with a second embodiment of the present invention. The fuse switch 30 includes a layer or thin film 32 disposed between a first electrode 34 and a second electrode 36. The layer 32 is formed by particles 38 dispersed in a carrier 40. The particles 38 of this embodiment are preferably microparticles or nanoparticles that may suitably be composed of an oxidizing metal, such as titanium, iron, copper, aluminum, or any other suitable organic or inorganic material that is electrically conductive, or any combination thereof.

In operation, the fuse switch 30 depicted in FIGS. 2A–2B works in the following manner. As is depicted in FIG. 2A, when the fuse switch 30 is in its initial state, the particles 38 are agglomerated or fused together to form a conductive path or fuse 42 between the first and second electrodes 34, 36, in the same manner as when the anti-fuse switch 10 is in its "on" state. This can be accomplished, for example, by programming the switch 30 during or subsequent to manufacturing. As is depicted in FIG. 2B, when a prescribed voltage (e.g., a high voltage) is applied across the first and second electrodes 34, 36, a current flows through the conductive path or fuse 42 that causes the agglomerated particles 38 to dissociate or disintegrate, in a manner similar to how an automotive fuse is blown. By thus melting or blowing the fuse 42, the fuse switch 30 is switched to its "off" state.

In addition, or alternatively, the carrier material of this embodiment may contain a suitable oxidant, such as air, hydrogen peroxide or a solid state oxidant such as $CrO_2F_2$, $CrOF_3$, $CrOF_2$, $M_2CrO_2F_4$, $M_2CrO_2(CF_3COO)_4$, peroxo-bridged iron porphyrin dimers, ferryl ($Fe^{IV}O^{2+}$) porphyrins and complexes of alkyl peroxides, so that when current flows through the conductive path 42, an oxidation reaction between the oxidant and particle materials (e.g., copper) is triggered that oxidizes the particles 38, thereby electrically isolating the particles 38 and breaking the conductive path 42.

With reference now to both FIGS. 1A–1D and 2A–2B, it can be seen that the anti-fuse switch 10 and the fuse switch 30 have opposite logic. In particular, the anti-fuse switch 10 is initially in an "off" or non-conducting state, and is turned on by application of a high voltage, whereas the fuse switch 30 is initially in an "on" or conducting state, and is turned off by application of a high voltage. Thus, when the antifuse switch 10 is switched on, it is in the same state as is the fuse switch 30 initially, and when the fuse switch 30 is switched off, it is in the same state as is the anti-fuse switch 10 initially. The anti-fuse switch 10 can be switched from its "on" state back to its "off" state in the same manner that the fuse switch 30 is switched from its "on" state to its "off" state, i.e., by blowing the fuse that connects or wires together the opposed first and second electrodes of the switch. Similarly, the fuse switch 30 can be switched from its "off" state back to its "on" state in the same manner that the anti-fuse switch 10 is switched from its "off" state to its "on" state, i.e., by application of a turn-on voltage that causes the dispersed particles to agglomerate or fuse together in the electrode region of the carrier. The maximum number of switching cycles and the switching speed can be varied by appropriate selection of material characteristics and electrical operating parameters.

The anti-fuse switch 10 and/or the fuse switch 30 can be implemented as one-time programmable switches or memory cells, or, alternatively, can be implemented as erasable or phase-reversible switches or memory cells.

Figure 3A:
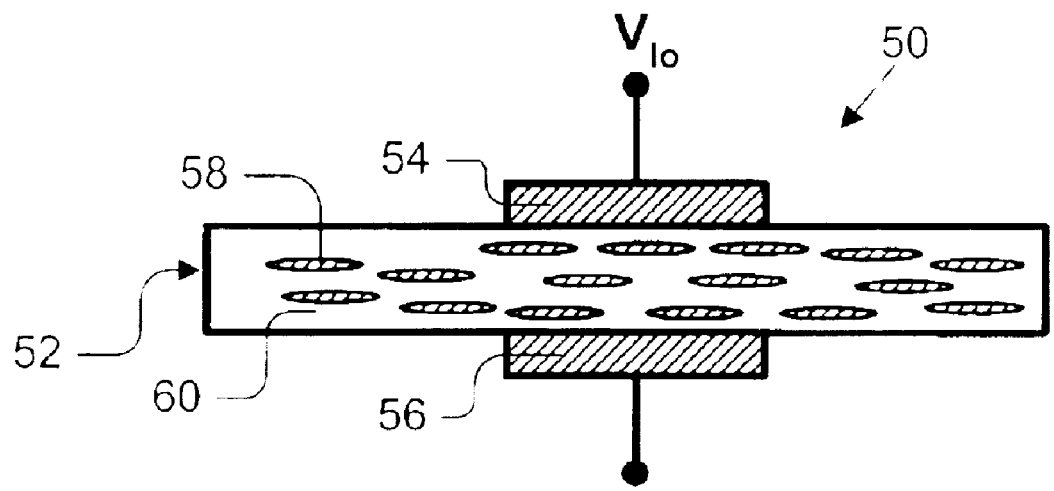
FIGS. 3A–3B are partial, cross-sectional views of a device according to another embodiment of the present invention; and, FIG. 4 is a perspective, cross-sectional view of a device according to another embodiment of the present invention.
Figure 3B:
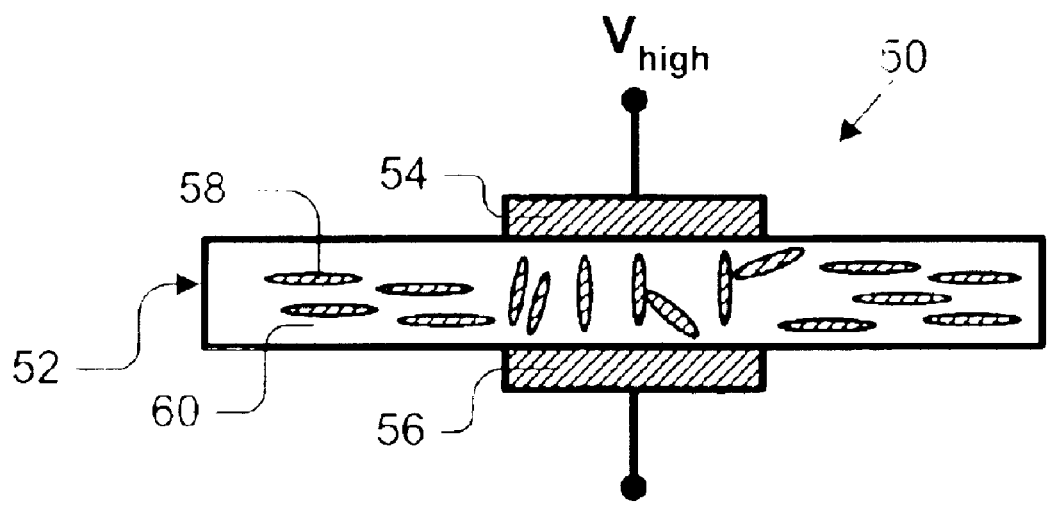

With reference now to FIGS. 3A–3B, there can be seen a dipole switch 50 constructed in accordance with a third embodiment of the present invention. The dipole switch 50 includes a layer or thin film 52 disposed between a first electrode 54 and a second electrode 56. The layer 52 is formed by dipole particles 58 dispersed in a carrier 60. The dipole particles 58 of this embodiment are preferably microparticles or nanoparticles that may suitably be composed of any electrically-charged, bipolar material, such as a ferroelectric material, e.g., a material selected from a group that includes $SrBi_2Ta_2O_9$, $BaTiO_3$ nanocrystals, NiCu and PdCo, BaTiO3, PbTiO3, and LiNbO. The dipole particles 58 are preferably elongated or rod-shaped. Dipole particles intrinsically align themselves with respect to an applied electrical field. Additionally, or alternatively, the dipole particles can be coated with an ionic and/or mechanical surfactant in order to enhance their inherent field alignment properties, i.e., their ability to change their physical orientation in response to an applied field.

The term "horizontal orientation" as used herein refers to the long axis of the dipole particles 58 being aligned parallel to the upper and lower surfaces of the substrate 52, and the term "vertical orientation" as used herein refers to the long axis of the dipole particles 58 being aligned perpendicular to the upper and lower surfaces of the substrate 52.

As is depicted in FIG. 3A, the dipole particles 58 are initially placed in a horizontal orientation with respect to the first and second electrodes 54, 56. This can be accomplished mechanically and/or electrically. Mechanically flowing the particle containing solution over a surface will cause the elongated particles to lie flat along the surface. Rubbing or orienting scratches in the electrodes can induce elongated particles to seek a given orientation by providing alignment grooves. Alternatively, pressure or appropriately charged surface treatments on the electrode surfaces or emulsifying agents on the particles can cause the particles to lie in a prescribed orientation with respect to the surface. With the dipole particles 58 in their horizontal orientation, the conductance between the first and second electrodes 54, 56 is low, whereby the dipole switch 50 is in its non-conducting or "off" state. As is depicted in FIG. 3B, when a threshold voltage greater than a rotation barrier voltage is applied across the first and second electrodes 54, 56, the dipole particles are rotated from a horizontal orientation to a vertical orientation.

The term "rotation barrier voltage" as used herein refers to the minimum level of a voltage applied in a direction perpendicular to a horizontal orientation of the dipole particles for rotating the dipole particles from a horizontal orientation to a vertical orientation. The level of the rotation barrier voltage can be varied by adjusting the viscosity of the carrier material and/or the strength of the dipole moment of the dipole particles.

As is depicted in FIG. 3B, when the voltage applied across the first and second electrodes 54, 56 exceeds the rotation barrier voltage, the dipole particles 58 naturally align themselves with the applied field, so that their long (vertical) axis is perpendicular to the first and second electrodes 54, 56. With the dipole particles 58 in their vertical orientation, the conductance between the first and second electrodes 54, 56 is high, so that the dipole switch 50 is in its conducting or "on" state. Thus, the application of a turn-on voltage greater than the rotation barrier voltage turns "on" the dipole switch 50, i.e., switches it from its "off" state to its "on" state.

Any of the switches 10, 30, 50 are suitable for use as a memory cell of a memory device. The "off" state of the switch 10, 30, 50 can represent a first logic value, and the "on" state can represent a second logic value. Accordingly, the present invention also encompasses a memory device that includes a plurality of switches as memory cells. In such a data storage device, the distance between the electrodes of adjacent memory cells is preferably selected to be greater than the percolation threshold, so that the probability of a conductive path being created between electrodes of neighboring memory cells is close to zero. Further, depletion of particles in the regions of the carrier between neighboring memory cells in response to application of the turn-on voltage serves to increase the electrical resistivity of these regions, thereby providing the desired electrical anisotropy. In this connection, the size and density of the particles, and the electrical resistivity of the carrier material can be selected to minimize lateral leakage current between neighboring memory cells.

In general, the memory device geometry governs the thickness of the substrate and the size of the particles. In very high-density memory devices, for example, the spacing between adjacent memory cells is less than one micron, e.g., $0.5\mu$. In general, the thickness of the substrate is much less than the distance between adjacent memory cells, e.g., $\frac{1}{3}$ to $\frac{1}{7}$ the spacing between memory cells. Thus, if the distance between memory cells is $0.5\mu$, then the thickness of the substrate may be on the order of $\frac{1}{5} \times 0.5\mu = 0.1\mu$. In general, the size of the particles is much less than the thickness of the substrate, e.g., $\frac{1}{3}$ to $\frac{1}{10}$ the thickness of the substrate. Thus, if the thickness of the substrate is $0.1\mu$, then the diameter (or maximum dimension) of the particles may be on the order of $0.01\mu$, or 10 nanometers.

Figure 4:
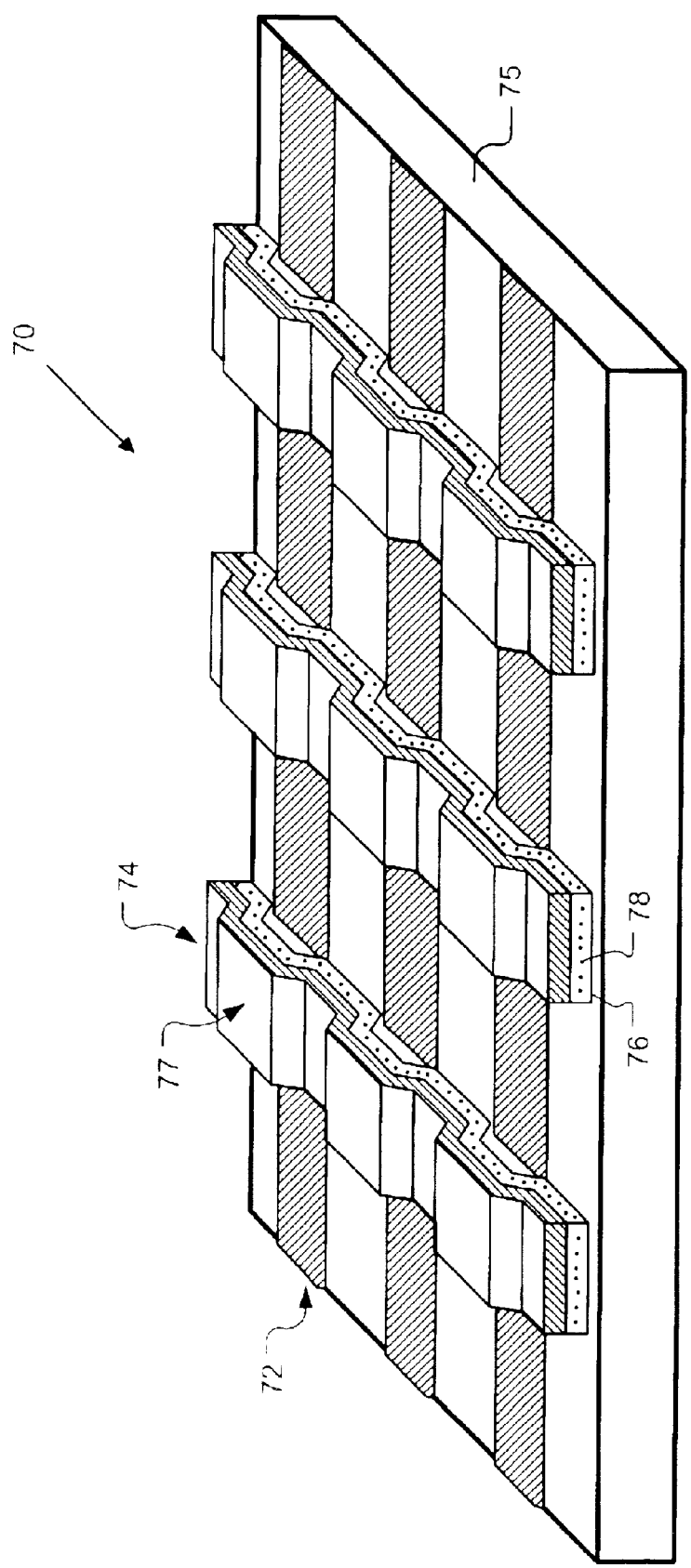

The memory device can alternatively be implemented using three-terminal memory cells rather than two-terminal memory cells. For example, FIG. 4 shows a memory cell array 70 that includes rows 72 of an electrically conductive material, such as doped silicon (Si), or metal on doped Si; and columns 74 of an electrically conductive material, such as doped Si or metal on doped Si, deposited on a base layer 75, such as polyamide, glass, or silicon. A gate dielectric layer 78 is formed beneath the columns 74. The gate dielectric layer 78 is composed of a layer of electrically resistive viscoelastic carrier material with particles 76 dispersed in it and optionally, a good dielectric layer impervious to the particles. A three-terminal memory cell 77 is formed by each adjacent pair of the rows 72 and an intersecting one of the columns 74. Each memory cell 77 can be embodied as either a fuse or anti-fuse transistor having a gate electrode 74 and an underlying gate dielectric layer 78 flanked by adjacent row conductors 72 that function as drain and source electrodes, respectively.

In operation, for an anti-fuse or fuse implementation, a high voltage applied to the gate electrode 74 of an individual memory cell 77 will cause the particles 76 dispersed in the underlying gate dielectric layer 78 to agglomerate or fuse together, thereby changing the current-voltage (IV) characteristics of the transistor formed by the gate, source, and drain electrodes. Typically, such changes will cause threshold voltage shifts in the transistor characteristics. These shifts can be used to store data in the memory cells 77. In general, any suitable current and/or voltage sensing or detection circuitry can be utilized to measure or detect current, voltage, and/or resistance changes brought about by changes in the IV characteristics of the individual memory cells 77. The measurements are used to read the data stored in the memory cells 77.

Alternatively, different voltages can be applied to neighboring rows 72 to produce a field gradient which causes a change in the gate capacitance due to migration of the particles 76. The changes in the gate capacitance of individual memory cells 77 can be detected by source-drain current measurements For example, the detection circuitry 81 can be utilized to measure or detect the source-drain current of the individual memory cells 77.

If the gate and a first electrode are held at a write voltage while the second electrode is held at ground, the particles will move in the gate dielectric layer near the second electrode, thereby altering the field due to the gate near the second electrode. When this second electrode is biased to act as a source, the corresponding source-drain current for a given gate voltage is changed. However, when the first electrode is biased to serve as the source, the source-drain current is relatively unaffected. Because of the source-drain symmetry, the characteristics of this second case can be changed when the gate and second electrode are held at a write voltage and the first electrode is held at ground. Therefore, two bits of information can be written in each transistor.

Although various illustrative embodiments of the present invention have been described herein, it should be understood that many variations, modifications, and alternative embodiments thereof that may appear to those having ordinary skill in the pertinent art are encompassed by the present invention, as defined by the appended claims.

What is claimed is:

1. A device comprising:
   a layer of material having particles dispersed therein;
   a first electrode on a first surface of the layer; and
   a second electrode on a second surface of the layer opposite the first surface;
   a state of the particles being changed when a prescribed voltage is applied across the first and second electrodes.

2. The device as set forth in claim 1, wherein:
   the particles are made of a diffusive metal dispersed in the material between the first and second electrodes; and
   the voltage causes the particles to agglomerate, thereby causing the device to go from a non-conductive state to a conductive state.

3. The device as set forth in claim 1, wherein:
   the particles are made of an oxidizing metal that form a conductive path between the electrodes; and
   the voltage causes the particles to oxidize and become non-conductive.

4. The device as set forth in claim 1, wherein:
   the particles are made of a diffusive metal that forms a conductive path between the electrodes; and
   the voltage causes the particles to disperse, thereby breaking the conductive path and causing the device to go from a conductive state to a non-conductive state.

5. The device as set forth in claim 1, wherein:
   the particles are dipoles; and
   the voltage causes the dipoles to rotate, the rotation affecting conductivity between the first and second electrodes.

6. A device including:
   a layer of material having particles dispersed therein;
   a first electrode disposed on a first surface of the layer; and,
   a second electrode disposed on a second surface of the layer opposite the first surface;
   wherein the particles have an initial state in which they do not form a conductive path between the first and second electrodes, and
   wherein the particles agglomerate and form a conductive path between the first and second electrodes in response to a prescribed voltage being applied across the first and second electrodes.

7. The device as set forth in claim 6, wherein the particles comprise electrically conductive nanoparticles.

8. The device as set forth in claim 6, wherein the particles diffuse due to migration in response to application of the prescribed voltage, resulting in an increased density of particles in a region of the layer between the first and second electrodes, and a decreased density of particles in a second region of the layer outside of the first region.

9. The device as set forth in claim 6, wherein the thickness of the layer and dispersion density of the particles are such that the probability of the formation of the conductive path between the first and second electrodes in response to application of the prescribed voltage is substantially 100%.

10. The device as set forth in claim 6, wherein the thickness of the layer is greater than a percolation threshold of the layer.

11. The device as set forth in claim 6, wherein the particles are comprised of a diffusive metal.

12. The device as set forth in claim 6, wherein the material is flexible.

13. The device as set forth in claim 6, wherein the device is operable as a one-time programmable switch.

14. A write-once memory cell including the device as set forth in claim 6.

15. A device comprising:
    a layer of material having particles dispersed therein;
    a first electrode disposed on a first surface of the layer; and
    a second electrode disposed on a second surface of the layer opposite the first surface;
    wherein the particles have an initial state in which they form a conductive path between the first and second electrodes, and
    wherein further, the conductive path is broken in response to a prescribed voltage being applied across the first and second electrodes.

16. The device as set forth in claim 15, wherein the particles comprise electrically conductive nanoparticles.

17. The device as set forth in claim 15, wherein:
    the conductive path comprises a fuse composed of agglomerated particles; and
    the fuse is blown in response to application of the prescribed voltage due to a current flowing through the fuse.

18. The device as set forth in claim 15, wherein the particles are comprised of an oxidizing metal.

19. The device as set forth in claim 18, wherein the material contains an oxidant for the oxidizing metal.

20. The device as set forth in claim 15, wherein the layer material is flexible.

21. The device as set forth in claim 15, wherein the device is operable as a one-time programmable switch.

22. A memory cell including the device as set forth in claim 15.

23. A device comprising:
    a layer at material having dipole particles dispersed therein;
    a first electrode disposed on a first surface of the layer; and,
    a second electrode disposed on a second surface of the layer;
    wherein the dipole particles are initially aligned in a first orientation, and are aligned in a second orientation when a prescribed voltage is applied, and
    wherein the dipole particles form a conductive path between the first and second electrodes when aligned in the second orientation, and do not form a conductive path between the first and second electrodes when aligned in the first orientation.

24. The device as set forth in claim 23, wherein the first orientation comprises a horizontal orientation with respect to upper and lower surfaces of the layer.

25. The device as set forth in claim 23, wherein the material comprises a viscoelastic material.

26. The device as set forth in claim 23, wherein the dipole particles comprise dipole nanoparticles.

27. The device as set forth in claim 23, wherein device comprises a one-time programmable switch.

28. A write-once memory cell including the device as set forth in claim 23.

29. A device comprising:
a gate electrode;
a gate dielectric layer beneath the gate electrode, the gate dielectric layer comprising a layer of material having particles dispersed therein;
a first electrically conductive element adjacent to a first side of the gate electrode; and
a second electrically conductive element adjacent to a second side of the gate electrode opposite the first side;
wherein the particles migrate in response to a prescribed voltage being applied to the gate electrode in such a manner as to alter current-voltage characteristics of the device.

30. The device as set forth in claim 29, wherein the particles are nanoparticles.

31. A transistor including the device as set forth in claim 29, wherein the first and second electrically conductive elements comprise source and drain electrodes.

32. The device as set forth in claim 31, wherein changes in the current-voltage characteristics of the transistor result in detectable changes in a gate capacitance of the transistor.

33. The device as set forth in claim 32, wherein the detectable changes in gate capacitance result in detectable changes in source-drain current.

34. A memory cell including the device as set forth in claim 29.

35. The device as set forth in claim 29, wherein the device can be programmed to store a first logic value by applying the prescribed voltage to both the gate electrode and the first electrically conductive element while holding the second electrically conductive element at a reference potential, and wherein the device can be programmed to store a second value by applying the prescribed voltage to both the gate electrode end the second electrically conductive element while holding the first electrically conductive element at the reference potential.

36. The device as set forth in claim 29, wherein the device is an anti-fuse device.

37. The device as set forth in claim 29, wherein the device is a fuse device.

38. A memory device comprising:
an array of memory cells, each of the memory cells comprising:
a gate electrode;
a gate dielectric layer beneath the gate electrode, the gate dielectric layer comprising a layer of material having particles dispersed therein;
a first electrically conductive element adjacent to a first side of the gate electrode; and
a second electrically conductive element adjacent to a second side of the gate electrode opposite the first side;
a state of the particles being changed when a prescribed voltage is applied across the first and second electrodes, to thereby write data into the memory cell, wherein a change in the state of the particles alters current-voltage characteristics of the memory cell.

39. The device of claim 37, further comprising read circuitry that detects changes in the current-voltage characteristics of the memory cells.

40. The memory device as set forth in claim 37, wherein, for each memory cell:
the particles are made of a diffusive metal dispersed in the material between the first and second electrodes; and
the voltage causes the particles to agglomerate, thereby causing the memory cell to go from a non-conductive state to a conductive state, whereby the memory cell functions as a fuse.

41. The memory device as set forth in claim 39, wherein, for each memory cell:
the particles are made of an oxidizing metal that form a conductive path between the electrodes; and
the voltage causes the particles to oxidize and become non-conductive, whereby the memory cell functions as an anti-fuse.

42. The memory device as set forth in claim 39 wherein for each memory cell:
the particles are made of a diffusive metal that forms a conductive path between the electrodes; and
the voltage causes the particles to disperse, ther by braking the conductive path and causing the memory cell to go from a conductive state to a non-conductive state, whereby the memory cell functions as an anti-fuse.

43. The memory device as set forth in claim 39, wherein for each memory cell:
the particles are dipoles; and
the voltage causes the dipoles to rotate, the rotation affecting conductivity of the memory cell.

44. A data storage device comprising a plurality of switches, each switch including a layer of material having particles dispersed therein, a first electrode on a first surface of the layer, and a second electrode on a second surface of the layer opposite the first surface; a state of the particles of a selected switch being changed when a prescribed voltage is applied across the first and second electrodes of the selected switch.

45. The device as set forth in claim 43, wherein the particles are made of a diffusive metal; and the prescribed voltage causes the particles to go from a non-conductive state to a conductive state.

46. The device as set forth in claim 43, wherein the particles are made of an oxidizing metal; and wherein the prescribed voltage causes the particles to oxidize and become non-conductive.

47. The device as set forth in claim 43, wherein the particles are made of a diffusive metal; and wherein the prescribed voltage causes the particles to go from a conductive state to a non-conductive state.

48. The device as set forth in claim 43, wherein the particles are dipoles; and wherein the prescribed voltage causes the dipoles to rotate, the rotation affecting conductivity of the selected switch.

* * * * *